United States Patent
Goh et al.

(10) Patent No.: US 10,492,299 B2
(45) Date of Patent: Nov. 26, 2019

(54) ELECTRONIC ASSEMBLY THAT INCLUDES A SUBSTRATE BRIDGE

(71) Applicant: Intel Corporation, Santa Clara, CA (US)

(72) Inventors: Eng Huat Goh, Penang (MY); Hoay Tien Teoh, Paya Terubong (MY); Jia Yan Go, Kulim (MY); Jenny Shio Yin Ong, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/774,863

(22) PCT Filed: Nov. 13, 2015

(86) PCT No.: PCT/US2015/060650
§ 371 (c)(1),
(2) Date: May 9, 2018

(87) PCT Pub. No.: WO2017/082927
PCT Pub. Date: May 18, 2017

(65) Prior Publication Data
US 2018/0324951 A1    Nov. 8, 2018

(51) Int. Cl.
| | |
|---|---|
| H05K 1/11 | (2006.01) |
| H05K 7/06 | (2006.01) |
| H05K 7/20 | (2006.01) |
| H01L 23/02 | (2006.01) |
| H01L 23/13 | (2006.01) |
| H01L 23/48 | (2006.01) |
| H01L 23/498 | (2006.01) |
| H05K 1/18 | (2006.01) |

(Continued)

(52) U.S. Cl.
CPC ............ *H05K 1/181* (2013.01); *H01L 25/105* (2013.01); *H05K 3/34* (2013.01); *H05K 3/3436* (2013.01);
(Continued)

(58) Field of Classification Search
CPC ... H05K 1/11; H05K 7/06; H05K 7/20; H01L 23/02; H01L 23/13; H01L 23/48; H01L 23/498
(Continued)

(56) References Cited

U.S. PATENT DOCUMENTS

| | | | | |
|---|---|---|---|---|
| 6,069,793 A | * | 5/2000 | Maruyama | G06F 1/20 165/104.33 |
| 7,729,121 B1 | * | 6/2010 | Deshpande | H01L 23/3677 165/80.3 |

(Continued)

FOREIGN PATENT DOCUMENTS

| | | |
|---|---|---|
| CN | 108353505 | 7/2018 |
| JP | 2001308257 A | 11/2001 |
| WO | WO-2017082927 A1 | 5/2017 |

OTHER PUBLICATIONS

"International Application Serial No. PCT/US2015/060650, International Search Report dated Jul. 29, 2016", 5 pgs.
(Continued)

*Primary Examiner* — Xiaoliang Chen
(74) *Attorney, Agent, or Firm* — Schwegman Lundberg & Woessner, P.A.

(57) ABSTRACT

The electronic assembly includes a printed circuit board; an electronic package that includes an electronic component mounted on a substrate, wherein the substrate is mounted to the printed circuit board; a first memory module mounted to the printed circuit board such that the first memory module is adjacent to the electronic package; a second memory
(Continued)

module mounted to the printed circuit board; and a substrate bridge that electrically connects the first and second memory modules to the electronic package, wherein a lower surface of the substrate bridge is connected to an upper surface of the substrate and an upper surface of the first and second memory modules.

8 Claims, 2 Drawing Sheets

(51) Int. Cl.
    *H05K 3/34* (2006.01)
    *H01L 25/10* (2006.01)

(52) U.S. Cl.
    CPC ........... *H01L 2224/81203* (2013.01); *H01L 2225/1023* (2013.01); *H01L 2225/1058* (2013.01); *H01L 2924/15311* (2013.01); *H01L 2924/15331* (2013.01); *H05K 2201/1053* (2013.01); *H05K 2201/10159* (2013.01); *H05K 2201/10378* (2013.01); *H05K 2201/10734* (2013.01); *Y02P 70/613* (2015.11)

(58) Field of Classification Search
    USPC ...... 174/760, 679.31, 679.4, 679.46, 679.54, 174/704, 767; 257/685, 774; 361/760, 361/679.31, 679.4, 679.46, 679.54, 704, 361/767
    See application file for complete search history.

(56) References Cited

U.S. PATENT DOCUMENTS

| | | | | |
|---|---|---|---|---|
| 9,466,561 | B2* | 10/2016 | Li | H01L 23/13 |
| 2005/0195629 | A1* | 9/2005 | Leddige | G11C 5/02 365/51 |
| 2006/0208348 | A1* | 9/2006 | Ohsaka | H01L 24/97 257/685 |
| 2007/0081376 | A1* | 4/2007 | Funaba | G11C 5/04 365/63 |
| 2010/0103604 | A1* | 4/2010 | Jafari | G06F 1/183 361/679.31 |
| 2013/0049224 | A1* | 2/2013 | Sutardja | H01L 23/13 257/774 |
| 2013/0242496 | A1* | 9/2013 | Ahmad | H05K 1/141 361/679.31 |
| 2014/0225280 | A1* | 8/2014 | Henderson | H01L 25/18 257/777 |
| 2014/0321803 | A1* | 10/2014 | Thacker | G02B 6/4274 385/14 |
| 2015/0016042 | A1* | 1/2015 | Zhang | G11C 11/34 361/679.31 |
| 2016/0358899 | A1* | 12/2016 | Lee | H01L 25/18 |

OTHER PUBLICATIONS

"International Application Serial No. PCT/US2015/060650, Written Opinion dated Jul. 29, 2016", 10 pgs.

* cited by examiner

ELECTRONIC ASSEMBLY THAT INCLUDES A SUBSTRATE BRIDGE

CROSS-REFERENCE TO RELATED APPLICATION

This application is a U.S. National Stage Filing under 35 U.S.C. 371 from International Application No. PCT/US2015/060650, filed on Nov. 13, 2015, and published as WO 2017/082927 on May 18, 2017, which application is incorporated herein by reference in its entirety.

TECHNICAL FIELD

Embodiments described herein generally relate to electronic assemblies, and more particularly to electronic assemblies that include a substrate bridge.

BACKGROUND

Many conventional electronic devices include platform designs that have a memory module placed on a board along with a silicon-on-chip electronic package. There are usually physical connections between the silicon-on-chip electronic package and the memory module through printed circuit board (e.g., a motherboard) routing within a printed circuit board. There is also typically physical connections between the silicon-on-chip electronic package and the memory module to other electronic components that are mounted on the platform.

The electronic routing between the silicon-on-chip electronic package and the memory module is extremely sensitive and requires proper isolation between signals that are located within the printed circuit board (i.e., the design must usually meet signal integrity specifications and printed circuit board design rules). The typical design usually requires multiple layers as well as relatively large amounts of real estate on the printed circuit board. Often times, the electronic routing between the silicon-on-chip electronic package and the memory module determines the layer count as well as the overall size of the printed circuit board.

In some conventional electronic devices, the size of the printed circuit board may be so large that battery capacity is often compromised. There is typically a design tradeoff with the size of the battery due to the size requirement of the printed circuit board in order to meet signal integrity specifications as well as printed circuit board design rules. This tradeoff in battery capacity occurs because the size of the battery must be reduced in order to accommodate the relatively large printed circuit board.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

The electronic assemblies described herein may include an interconnect structure between a silicon-on-chip electronic package and a memory module. The silicon-on-chip electronic package and memory module may be interconnected using a substrate bridge might permit the overall size of an electronic device that includes the electronic assembly to be reduced.

Figure 1:
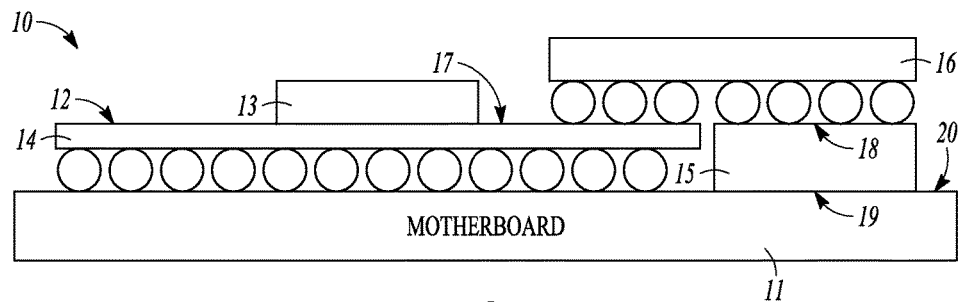
FIG. 1 shows a schematic section view of an example electronic assembly.

FIG. 1 shows a schematic section view of an example electronic assembly 10. The electronic assembly 10 includes a printed circuit board 11 (e.g., a motherboard) and an electronic package 12 that includes an electronic component 13 mounted on a substrate 14. The substrate 14 is mounted to the printed circuit board 11.

The electronic assembly 10 further includes a memory module 15 that is mounted to the printed circuit board 11 such that the memory module 15 is adjacent to the electronic package 12. A substrate bridge 16 electrically connects the memory module 15 to the electronic package 12. The substrate bridge 16 is connected to an upper surface 17 of the substrate 14 and an upper surface 18 of the memory module 15.

In some forms, the electronic component 13 is a die. It should be noted that other types of electronic components are contemplated for use in the electronic assembly 10. The type of electronic component that is included in the electronic assembly 10 will depend on the application where the electronic assembly 10 is to be used (among other factors).

The substrate 14 may be attached to the printed circuit board 11 with solder balls. It should be noted that the substrate 14 may be attached to the printed circuit board 11 in any manner that is known now, or discovered in the future.

In some forms, the memory module 15 is a DRAM (dynamic random access memory). In the example form illustrated in FIG. 1, a lower surface 19 of the DRAM is adhered to an upper surface 20 of the printed circuit board 11. As an example, the memory module 15 may be adhered to the substrate bridge 16 using solder balls. In addition, the substrate bridge 16 may be adhered to the upper surface 17 of the substrate 14 using solder balls.

In come forms, the electronic component 13 may be thermal compression bonded to the substrate 14. The manner in which the electronic component 13 is attached to the substrate 14 will depend in part on the manufacturing considerations that are associated with fabricating the electronic package 12 (among other factors).

The inclusion of the substrate bridge 16 may allow the electronic assembly 10 to be fabricated in a more compact fashion such that the electronic assembly 10 may be easier to incorporate into various electronic applications (e.g., mobile and/or wearable devices). In addition, an electronic assembly 10 that includes the substrate bridge 16 may improve the signal quality between electronics within the electronic assembly 10. The electronic assembly 10 may also permit the reduction of the overall printed circuit board layer count for a given platform design.

As an example, the substrate bridge may be fabricated with finer design rules (e.g., 20/20 um traces/spacing). These finer design rules allow signal routing to be done in more compact real estate. In addition, the electronic package 12 and memory module 15 may be placed closely to each other which may also provide more compact real estate.

The relatively short routing between the memory module 15 and the electronic package 12 may also translate into better signal integrity performance. The use of the substrate bridge 16 also reduces the physical routings that would otherwise be on the printed circuit board 11. The elimination of these routings within the printed circuit board 11 may permit a reduction in the overall printed circuit board 11 layer count.

When electronic devices include the electronic assembly 10, there may be a reduction in the real estate occupied by the electronic assembly 10. This real estate reduction may provide for design benefits relative to the rest of the electronic device. As an example, reducing the size of the electronic assembly 10 may permit a larger battery to be incorporated into the electronic device.

Figure 2:
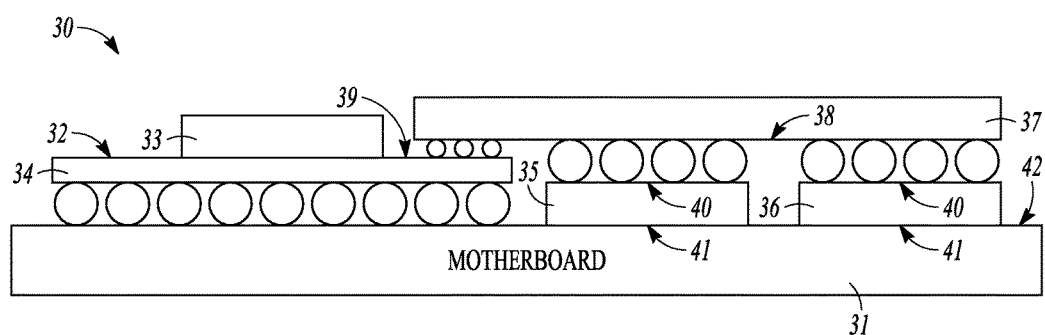
FIG. 2 shows a schematic section view of another example electronic assembly.
Figure 3:
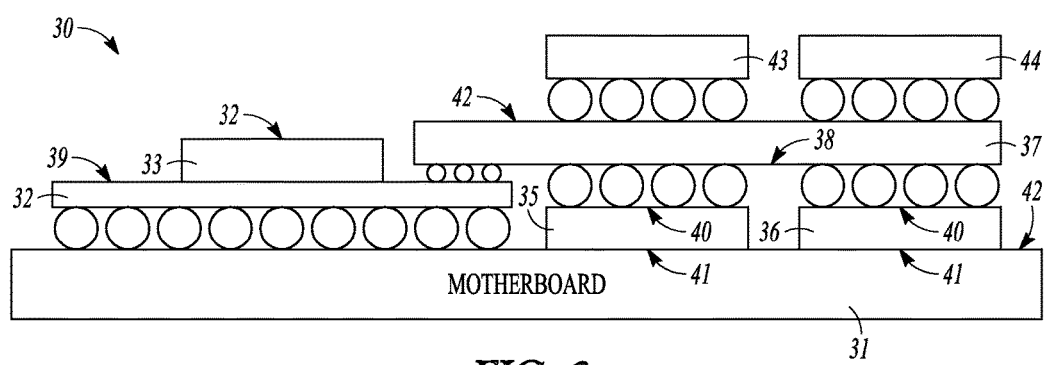
FIG. 3 shows a schematic section view of yet another example electronic assembly.

FIGS. 2 and 3 illustrate another example electronic assembly 30. The electronic assembly 30 includes a printed circuit board 31 (e.g., a motherboard) and an electronic package 32 that includes an electronic component 33 mounted on a substrate 34. The substrate 34 is mounted to the printed circuit board 31.

A first memory module 35 is mounted to the printed circuit board 31 such that the first memory module 35 is adjacent to the electronic package 32. A second memory module 36 is also mounted to the printed circuit board 31.

A substrate bridge 37 electrically connects the first and second memory modules 35, 36 to the electronic package 32. A lower surface 38 of the substrate bridge 37 is connected to an upper surface 39 of the substrate 34 and an upper surface 40 of the first and second memory modules 35, 36.

In some forms, the substrate 34 is attached to the printed circuit board 31 with solder balls. In addition, a lower surface 41 of each of the first and second memory modules 35, 36 may be adhered to an upper surface 42 of the printed circuit board 31.

As shown in FIG. 3, the electronic assembly 30 may further include a third memory module 43 that is mounted to an upper surface 44 of the substrate bridge 37 such that the third memory module 43 is adjacent to the electronic package 32. The electronic assembly 30 may further include a fourth memory module 44 that is mounted to the upper surface 42 of the substrate bridge 37.

In some forms, the first, second, third and fourth memory modules 35, 36, 43, 44 are attached to the substrate bridge 37 using solder balls. In addition, the substrate bridge 37 may be attached to the upper surface 39 of the substrate 34 using the solder balls.

The first, second, third and fourth memory modules 35, 36, 43, 44 may be attached to the substrate bridge 37 in any manner that is known now, or discovered in the future. The manner in which the first, second, third and fourth memory modules 35, 36, 43, 44 are attached to the substrate bridge 37 will depend in part on the manufacturing considerations that are associated with fabricating the electronic assembly 30 (among other factors).

In addition, the substrate bridge 37 may be attached to the upper surface 39 of the substrate 34 in any manner that is known now, or discovered in the future. The manner in which the substrate bridge 37 is attached to the substrate 34 will depend in part on the overall design of the electronic assembly 30 (among other factors).

In some forms, the electronic component 33 is a die. In addition, one, some or all of the first, second, third and fourth memory modules 35, 36, 43, 44 may be DRAM.

Figure 4:
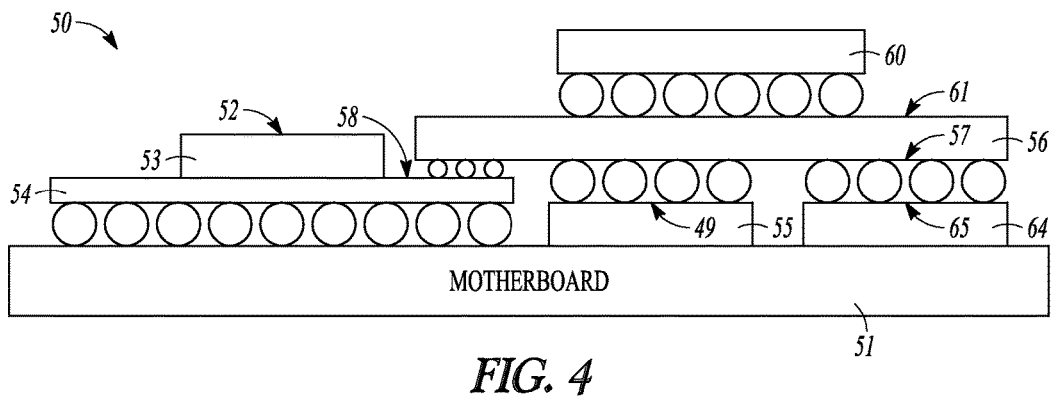
FIG. 4 shows a schematic section view of still another example electronic assembly.

FIG. 4 shows a schematic view of yet another example electronic assembly 50. The electronic assembly 50 includes a circuit board 51 and an electronic package 52 that includes an electronic component 53 mounted on a substrate 54. The substrate 54 is mounted to the printed circuit board 51.

The electronic assembly 50 further includes a memory module 55 that is mounted to the printed circuit board 51 such that the memory module 55 is adjacent to the electronic package 52. A substrate bridge 56 electrically connects the memory module 55 to the electronic package 52. A lower surface 57 of the substrate bridge 56 is connected to an upper surface 58 of the substrate 54 and an upper surface 59 of the memory module 55.

The electronic assembly further includes an electronic device 60 mounted to an upper surface 61 of the substrate bridge 56. As an example, the electronic component 53 may be a die and the electronic device 60 may be a storage module (e.g., an eMMC).

In some forms, the substrate 54 may be attached to the printed circuit board 51 with solder balls. It should be noted that the substrate 54 may be attached to the printed circuit board 51 in any manner that is known now, or discovered in the future. In addition, a lower surface 62 of the memory module 55 may be adhered to an upper surface 63 of the printed circuit board 51. It should be noted that the memory module 55 may be adhered (or attached) to the printed circuit board 51 in any manner known now, or discovered in the future.

The substrate bridge 56 may be attached to the upper surface 58 of the substrate 54 using solder balls. It should be noted that the substrate bridge 56 may be attached to the substrate 54 in any manner that is known now, or discovered in the future.

In some forms, the memory module 55 and the electronic device 60 are attached to the substrate bridge 56 using solder balls. It should be noted that the memory module 55 and the electronic device 60 may be attached to the substrate bridge 56 in any manner that is known now, or discovered in the future.

The electronic assembly 50 may further include a second memory module 64 that is mounted to the printed circuit board 51. The substrate bridge 56 electrically connects the second memory module 64 to the electronic package 52. As illustrated in FIG. 4, a lower surface 57 of the substrate bridge 56 is connected to an upper surface 65 of the second memory module 64.

The electronic assemblies 10, 30, 50 described herein may allow for smaller electronic assemblies to be included in electronic devices that utilize such electronic assemblies. In addition, the electronic assemblies 10, 30, 50 described herein may be cost effective to manufacture due to a relatively smaller size and/or lower layer counts within the electronic assemblies 10, 30, 50.

Figure 5:
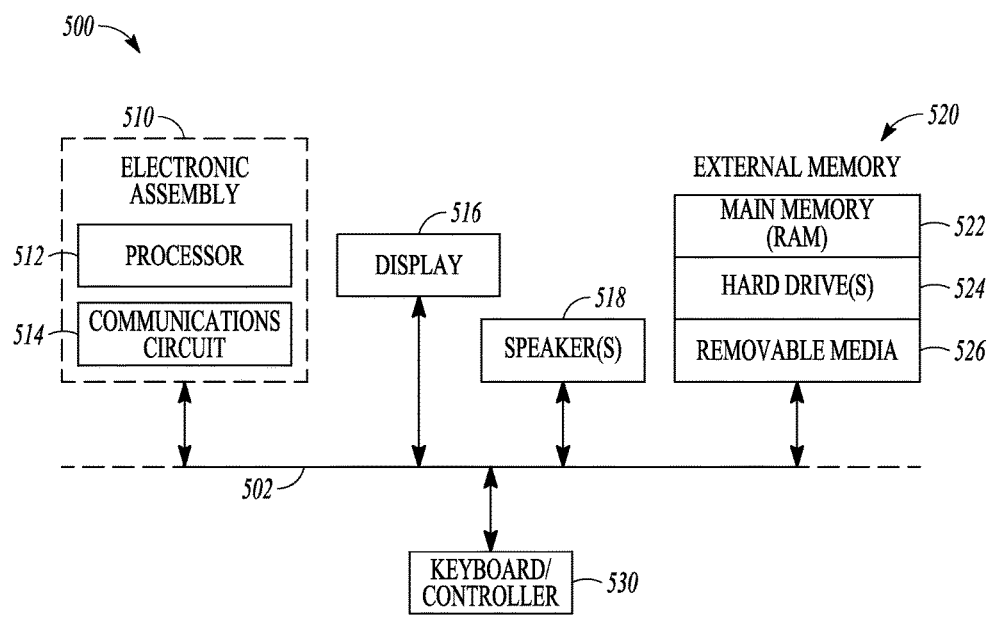
FIG. 5 is block diagram of an electronic apparatus that includes the electronic assemblies described herein.

FIG. 5 is a block diagram of an electronic apparatus 500 incorporating at least electronic assembly described herein. Electronic apparatus 500 is merely one example of an electronic apparatus in which forms of the electronic assemblies described herein may be used.

Examples of an electronic apparatus 500 include, but are not limited to, personal computers, tablet computers, mobile telephones, game devices, MP3 or other digital music players, etc. In this example, electronic apparatus 500 comprises a data processing system that includes a system bus 502 to couple the various components of the electronic apparatus 500. System bus 502 provides communications links among the various components of the electronic apparatus 500 and may be implemented as a single bus, as a combination of busses, or in any other suitable manner.

An electronic assembly 510 as describe herein may be coupled to system bus 502. The electronic assembly 510 may include any circuit or combination of circuits. In one embodiment, the electronic assembly 510 includes a processor 512 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic assembly 510 are a custom circuit, an application-specific integrated circuit (ASIC), or the like, such as, for example, one or more circuits (such as a communications circuit 514) for use in wireless devices like mobile telephones, tablet computers, laptop computers, two-way radios, and similar electronic systems. The IC can perform any other type of function.

The electronic apparatus 500 may also include an external memory 520, which in turn may include one or more memory elements suitable to the particular application, such as a main memory 522 in the form of random access memory (RAM), one or more hard drives 524, and/or one or more drives that handle removable media 526 such as compact disks (CD), flash memory cards, digital video disk (DVD), and the like.

The electronic apparatus 500 may also include a display device 516, one or more speakers 518, and a keyboard and/or controller 530, which can include a mouse, trackball, touch screen, voice-recognition device, or any other device that permits a system user to input information into and receive information from the electronic apparatus 500.

To better illustrate the electronic assemblies disclosed herein, a non-limiting list of examples is provided here:

Example 1 includes an electronic assembly. The electronic assembly includes a printed circuit board; an electronic package that includes an electronic component mounted on a substrate, wherein the substrate is mounted to the printed circuit board; a memory module mounted to the printed circuit board such that the memory module is adjacent to the electronic package; and a substrate bridge that electrically connects the memory module to the electronic package, wherein the substrate bridge is connected to an upper surface of the substrate and an upper surface of the memory module.

Example 2 includes the electronic assembly of example 1, wherein the electronic component is a die.

Example 3 includes the electronic assembly of any one of examples 1-2, wherein the substrate is attached to the printed circuit board with solder balls.

Example 4 includes the electronic assembly of any one of examples 1-3, wherein the memory module is a DRAM.

Example 5 includes the electronic assembly of any one of examples 1-4, wherein a lower surface of the memory module is adhered to an upper surface of the printed circuit board.

Example 6 includes the electronic assembly of examples 1-5, wherein the memory module is attached to the substrate bridge using solder balls.

Example 7 includes the electronic assembly of any one of examples 1-6, wherein the substrate bridge is attached to the upper surface of the substrate using solder balls.

Example 8 includes the electronic assembly of any one of examples 1-7, wherein the printed circuit board is a motherboard.

Example 9 includes the electronic assembly of any one of examples 1-8, wherein the electronic component is thermal compression bonded to the substrate.

Example 10 includes an electronic assembly. The electronic assembly includes a printed circuit board; an electronic package that includes an electronic component mounted on a substrate, wherein the substrate is mounted to the printed circuit board; a first memory module mounted to the printed circuit board such that the first memory module is adjacent to the electronic package; a second memory module mounted to the printed circuit board; and a substrate bridge that electrically connects the first and second memory modules to the electronic package, wherein a lower surface of the substrate bridge is connected to an upper surface of the substrate and an upper surface of the first and second memory modules.

Example 11 includes the electronic assembly of example 10, wherein the substrate is attached to the printed circuit board with solder balls, and wherein a lower surface of each of the first and second memory modules is adhered to an upper surface of the printed circuit board.

Example 12 includes the electronic assembly of any one of examples 10-11, and further including a third memory module mounted to an upper surface of the substrate bridge adjacent to the electronic package.

Example 13 includes the electronic assembly of any one of examples 10-12, and further including a fourth memory module mounted to the upper surface of the substrate bridge.

Example 14 includes the electronic assembly of any one of examples 10-13, wherein the first, second, third and fourth memory modules are attached to the substrate bridge using solder balls, and the substrate bridge is attached to the upper surface of the substrate using solder balls.

Example 15 includes the electronic assembly of any one of examples 13-14, wherein the electronic component is a die and the first, second, third and fourth memory modules are DRAM.

Example 16 includes an electronic assembly. The electronic assembly includes a printed circuit board; an electronic package that includes an electronic component mounted on a substrate, wherein the substrate is mounted to the printed circuit board; a memory module mounted to the printed circuit board such that the memory module is adjacent to the electronic package; a substrate bridge that electrically connects the memory module to the electronic package, wherein a lower surface of the substrate bridge is connected to an upper surface of the substrate and an upper surface of the memory module; and an electronic device mounted to an upper surface of the substrate bridge.

Example 17 includes the electronic assembly of example 16, wherein the electronic component is a die and the electronic device is a storage module.

Example 18 includes the electronic assembly of any one of examples 16-17, wherein the storage module is an eMMC.

Example 19 includes the electronic assembly of any one of examples 16-18, wherein the substrate is attached to the printed circuit board with solder balls, and wherein a lower surface of the memory module is adhered to an upper surface of the printed circuit board, and wherein the substrate bridge is attached to the upper surface of the substrate using solder balls, and wherein the memory module and the electronic device are attached to the substrate bridge using solder balls.

Example 20 includes the electronic assembly of any one of examples 16-19, and further including a second memory module mounted to the printed circuit board, wherein the substrate bridge electrically connects the second memory module to the electronic package, and wherein the lower surface of the substrate bridge is connected to an upper surface of the second memory module.

This overview is intended to provide non-limiting examples of the present subject matter. It is not intended to provide an exclusive or exhaustive explanation. The detailed description is included to provide further information about the electronic assemblies described herein.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

The Abstract is provided to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An electronic assembly, comprising:
   a printed circuit board;
   an electronic package that includes an electronic component mounted on a substrate, wherein the substrate is mounted to the printed circuit board;
   a first memory module mounted to the printed circuit board such that the first memory module is adjacent to the electronic package;
   a second memory module mounted to the printed circuit board; and
   a substrate bridge that electrically connects the first and second memory modules to the electronic package, wherein a lower surface of the substrate bridge is connected to an upper surface of the substrate and an upper surface of the first and second memory modules, wherein the substrate is attached to the printed circuit board with solder balls, and wherein a lower surface of each of the first and second memory modules is adhered to an upper surface of the printed circuit board.

2. The electronic assembly of claim 1, wherein the substrate bridge is attached to the upper surface of the substrate using solder balls.

3. The electronic assembly of claim 1, wherein the printed circuit board is a motherboard.

4. The electronic assembly of claim 1, wherein the electronic component is thermal compression bonded to the substrate.

5. The electronic assembly of claim 1, further comprising a third memory module mounted to an upper surface of the substrate bridge adjacent to the electronic package.

6. The electronic assembly of claim 5, further comprising a fourth memory module mounted to the upper surface of the substrate bridge.

7. The electronic assembly of claim 6, wherein the first, second, third and fourth memory modules are attached to the substrate bridge using solder bails, and the substrate bridge is attached to the upper surface of the substrate using solder balls.

8. The electronic assembly of claim 6, wherein the electronic component is a die and the first, second, third and fourth memory modules are DRAM.

* * * * *